United States Patent [19]

Oehr et al.

[11] Patent Number: 5,019,415
[45] Date of Patent: May 28, 1991

[54] PROCESS FOR DEPOSITING AN ADHERENT SILVER FILM

[75] Inventors: Christian Oehr, Reusten; Harald Suhr, Tübingen, both of Fed. Rep. of Germany

[73] Assignee: Schering Aktiengesellschaft, Berlin and Bergkamen, Fed. Rep. of Germany

[21] Appl. No.: 394,828

[22] Filed: Aug. 16, 1989

[30] Foreign Application Priority Data

Aug. 16, 1988 [DE] Fed. Rep. of Germany ....... 3828211

[51] Int. Cl.$^5$ ................................................ B05D 3/06
[52] U.S. Cl. ......................................... 427/39; 204/19; 204/20; 204/23; 204/49; 204/52.1; 427/124; 427/125; 427/253; 427/255.1; 427/404; 427/443.1
[58] Field of Search ................ 427/39, 124, 125, 253, 427/255.1, 404, 443.1; 204/19, 20, 23, 49, 52.1

[56] References Cited

U.S. PATENT DOCUMENTS 2,501,563 3/1950 Colbert et al. .......................... 427/39
3,087,838 4/1963 Lubin ...................................... 427/39
4,226,896 10/1980 Coburn et al. ..................... 427/39 X

*Primary Examiner*—Bernard Pianalto
*Attorney, Agent, or Firm*—Michael J. Striker

[57] ABSTRACT

The process for depositing an adherent silver film, especially on a nonconducting substrate, involves depositing the silver film from the gas phase. A plasma discharge in a gas containing volatile silver organic compounds is used. The silver compounds advantageously contain silver atoms which are bonded to an $sp^2$-hybridized carbon atom and are halogen-containing, particularly fluorine-containing compounds. The compounds $CF_3-CAg=CF-CF_3$, $CF_3-CAg=CF_2$ and pentafluorophenyl silver may be used. The silver film so formed may be strengthened electrochemically or by chemical reduction. The silver film products are useful as electrically conducting, decorative or reflective layers.

15 Claims, No Drawings

PROCESS FOR DEPOSITING AN ADHERENT SILVER FILM

BACKGROUND OF THE INVENTION

Our invention relates to a method or process for depositing an adherent silver film.

The deposition of metallic films on nonconducting substrates occurs in a conventional manner by wet chemistry methods, in which the component to be metallized is treated with a specially formulated cleaning, etching, conditioning, activating and metallizing bath for a substrate. After cleaning and conditioning next the surface is treated to form nuclei with a noble metal-containing solution and after that metallized according to a conventional process or method.

The treatment baths are usually aqueous solutions containing however an organic solvent component. Disadvantageously this formula for the treatment bath has a high toxicity with considerable volatility of the compounds used, which presupposes corresponding safety precautions.

A further disadvantage of the wet chemistry process is that relatively complex treatment procedures are provide before metallization to achieve the desired adherence. In each case the technical process parameters, such as temperature and treatment time are maintained within narrow limits so that an extensive process control of the process conditions is necessary. The danger of contamination of the treatment bath and process-required fluctuations is large and can clearly cause fluctuations in the quality of the product. The reactivity of the treatment solution itself acts to reduce the quality of a covering lacquer or foil.

Also disadvantageous is the large expense for waste water treatment of the numerous bath solutions and rinses, since many strong etching or heavy metal-containing electrolytes are used.

Especially onerous is the disadvantageous requirement that extensive process adjustments are necessary when different type substrates are to be metallized. The applicable range of a particular wet chemistry process is so narrow under certain conditions that considerable process changes are required when different filler material is used in an organic polymer substrate. A carry-over of process parameters from one material to be coated to another is in any case not possible with a wet chemistry metallization method.

Another known deposition and/or coating method involves thermal decomposition of volatile compounds. This method presupposes very high substrate temperatures of at least 200° C. to 1000° C., which however may be attained for many materials not or only under the danger of material damage.

SUMMARY OF THE INVENTION

Accordingly, it is an object of our invention to provide a method for depositing a silver film, which allows deposition of an adherent silver film at comparatively low temperatures and in the absence of solvent.

It is also an object of our invention to provide an improved silver film and associated products such as reflective or decorative layers or coatings.

In keeping with these objects and with others which will become apparent hereinafter, the deposition occurs from the gas phase.

First volatile organic silver compounds are part of the gas phase from which the deposition occurs. Silver compounds may be used in which silver atoms are bound to $sp^2$-hybridized carbon atoms. In other examples of our invention the silver compounds contain halogen atoms. Also fluorinated silver compounds may be used, specifically $CF_3$—$CAg$=$CF$—$CF_3$ and $CF_3$—$CAg$=$CF_2$. Also pentafluorophenyl silver can be used.

The gas phase silver compounds are decomposed in a glow discharge zone. The undecomposed silver compounds in the gas phase can be converted. Additional carrier gases can be used. The silver film advantageously is thickened or strengthened electrochemically and/or if necessary by chemical reduction. Advantageously a chemically reductive copper or nickel bath can be used. The deposition of the silver can occur on a nonconducting or conductive surface.

The materials coated by the method of our invention with a silver film are used as a semifinished product in the Electronic Industry, e.g. for making electrical contacts on insulating substrates. Other applications use the advantageous reflective properties of the silver as a reflector. Silver can advantageously be used as a reflective metal in mirror manufacture or in optical storage media, such as compact discs. Moreover decorative applications are also possible. For all applications an adherent bond between the base and the silver is required. When partially covered metallized semifinished products are required, as they sometimes are in electronic industry applications, a partial metallization is required. Moreover a thin silver layer can be applied also as an activator for a subsequent electrochemical or currentless metallization, e.g. is applied with currentless copper-, nickel, gold-, tin- or other electrolytes.

The process according to our invention avoids the disadvantages of the current method, since the wet chemical process waste discharge is avoided. According to our invention the deposition of silver film from the gas phase takes place in a plasma by decomposition of silver compounds. Thus, according to the treatment time, layers of several hundred to about 2000 Angstroms thick are obtained, which if necessary subsequently—without additional treatment—advantageously can be thickened or strengthened in a chemical copper-, gold-, tin- or nickel or after a metallization in a chemical bath, in a galvanic bath, advantageously a copper, nickel, gold, palladium or chromium bath until at the desired thickness.

In cases of thicker combined metal layers made according to the methods of our invention it is also advantageous to directly apply additional metal by electrochemical metallization.

A product of a metallic structure can be produced according to one of the known methods(additive-, semiadditive- or substrate technology), e.g. when the substrate surface is covered by a mask during metallization, so that only the locations are exposed which the metal structure should cover.

Other examples of metallic structure, e.g. with the aid of screen printing lacquer, photolacquer or photoresist films can be similarly used.

The volatile silver compounds used are made in a known process or in themselves known.

All silver compounds, which can be transferred to the gas phase without decomposition, are suitable.

Among these silver compounds we include perhalogenated, advantageously perfluorinated, organic silver compounds, in which silver is bonded to a carbon atom lying in a CC double bond. Advantageously especially $CF_3-CAg=CF-CF_3$, $CF_3-CAg=CF_2$ and pentafluorophenyl silver can be used.

The film deposition occurs in a normal plasma reactor, which is principally known as a pipe or tunnel reactor or in a parallel plate reactor or reactor for corona discharge. To make these metal films and structures the plasma can be used both as a direct current and also with alternating current or high frequency current-(including microwaves), generally in the KHz- or MHz-region. The pressure in the plasma chamber amounts to about 0.2 to 1.0 hPa. As a substrates organic polymers and also inorganic materials such as ceramics($Al_2O_3$, AlN, BN, $W_2C$, $B_4$ and others) and quartz and/or quartz glass and their mixtures in different embodiments can be used: as plates, three dimensional molded bodies or foils, with or without filling materials, single or many-layered material. Many layer circuit elements, which are made from a surface structure of copper alternating with insulating material, are used in the electronic industry applications.

The silver compounds used according to our invention are fed to the plasma reactor as gases, advantageously by sublimation or vaporization. They can be used alone, however advantageously also diluted in a carrier gas, to obtain a layer uniformly free of pores. As a carrier gas various inert gases are suitable, including argon or helium, or a reducing gas such as hydrogen may be included. Also mixtures of these gases can be used. The metering of the silver compounds occurs after setting the vacuum or low pressure beyond the glow discharge zone in the flow of the carrier gas, so that a uniform gas mixture is present in the actual reaction zone. The supply container for the metal compound is provided appropriately with an apparatus for heating to conduct metal compounds which are difficult to sublime in sufficient flow rates in the gas flow.

A special embodiment of our invention consists of the following: that prior to metallizing a plasma etching process takes place in the plasma discharge to clean the substrate surface and to make it susceptible to receive the metal layer. The structure of the reactor used for this embodiment and the process requirements do not differ in principle from plasma metallizing processes.

It is to be understood that in plasma-etching processes no metal-organic compounds are to be used. Advantageously reactive gases, such as oxygen or tetrafluoromethane-oxygen mixtures, can be added to the inert carrier gas stream.

As additional suitable substrates for silver film deposition according to our invention the following can be listed: glass, ceramic material, teflon and metal, such as aluminum, e.g. aluminum electrodes.

The following Example serves for illustration of the invention.

EXAMPLE

| Reactor type: | Parallel plate reactor |
|---|---|
| Frequency: | 13.56 MHz |
| Substrate: | Glass plates 50 × 50 mm. |
| Substrate temperature: | 120° C. |

The apparatus was pumped-down for the experiment to a pressure less than 10 Pa. Then 15 Pa Argon and 10 Pa hydrogen were admitted to the process reactor. From a storage tank heated to 90 to 95° C. $CF_3-CAg=CF-CF_3$ was sublimed into the process reactor and conducted subsequently under continuous argon/hydrogen flow. The plasma was operated at a power of 45 watts. The deposition rate amounts to about 40 A/min.

One obtains a highly polished satisfactory adhering silver mirror with a specific conductance of about $4.10^5$ $S.cm^{-1}$.

It will be understood that each of the elements described above, or two or more together, may also find a useful application in other types of constructions differing from the types described above.

While the invention has been illustrated and described as embodied in a method for depositing an adherent silver film and products of the same, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of the prior art, fairly constitute essential characteristics of the generic or specific aspects of this invention.

What is claimed as new and desired to be protected by Letters Patent is set forth in the appended claims.

1. In a process for depositing an adherent silver film, the improvement comprising the step of depositing said silver film from a glow discharge zone in a gas phase containing a volatile silver compound, said silver compound also being an organic compound.

2. The improvement according to claim 1, wherein said depositing of said silver film occurs on a nonconducting surface.

3. The improvement according to claim 1, wherein said depositing of said silver film occurs on a conducting surface.

4. The improvement according to claim 1, wherein said silver compound contains a silver atom which is bonded to an $sp^2$-hybridized carbon atom.

5. The improvement according to claim 1, wherein said silver compound is a halogen-containing compound.

6. The improvement according to claim 1, wherein said silver compound is a fluorine-containing compounds.

7. The improvement according to claim 6, wherein said silver compound comprises $CF_3-CAg=CF-CF_3$.

8. The improvement according to claim 6, wherein said silver compound comprises $CF_3-CAg=CF_2$.

9. The improvement according to claim 6, wherein said silver compound comprises pentafluorophenyl silver.

10. The improvement according to claim 1, further comprising thickening said silver film electrochemically.

11. The improvement according to claim 1 further comprising transporting said silver compound without decomposition into said gas phase prior to said decomposing.

12. The improvement according to claim 1, further comprising using an additional carrier gas.

13. The improvement according to claim 1, further comprising thickening said silver film by chemical reduction.

14. The improvement according to claim 13, further comprising using a chemically reductive nickel bath.

15. The improvement according to claim 13, further comprising using a chemically reductive cooper bath.

* * * * *